United States Patent

[11] 3,571,623

[72] Inventors Richard D. Church
Candor;
Francis L. O'Malley, Apalachin, N.Y.
[21] Appl. No. 693,674
[22] Filed Dec. 26, 1967
[45] Patented Mar. 23, 1971
[73] Assignee International Business Machines Corporation
Armonk, N.Y.

[54] TRANSISTORIZED SWITCHING CIRCUIT AND DRIVER MEANS THEREFOR
11 Claims, 10 Drawing Figs.

[52] U.S. Cl. .......... 307/254, 307/242, 307/270, 307/293
[51] Int. Cl. .......... H03k 17/00
[50] Field of Search .......... 307/239, 242, 243, 247, 253, 254, 220, 293; 328/71, 72, 74, 129

[56] References Cited
FOREIGN PATENTS
1,008,714 11/1965 Great Britain .......... 307/253

*Primary Examiner*—Donald D. Forrer
*Assistant Examiner*—John Zazworsky
*Attorneys*—Hanifin and Jancin and Norman R. Bardales

ABSTRACT: A transistorized switching circuit which employs a driver means that provides turn-on and turnoff driver signals to control input. The driver circuit provides a constant turnoff time period for the turnoff signals. In the preferred embodiment, a transformer-coupled driver circuit having controllable selective means for energizing the transformer windings is disclosed.

INVENTORS
RICHARD D. CHURCH
FRANCIS L. O'MALLEY

BY
Norman R. Bardales
ATTORNEY

PATENTED MAR 23 1971 SHEET 4 OF 5 3,571,623

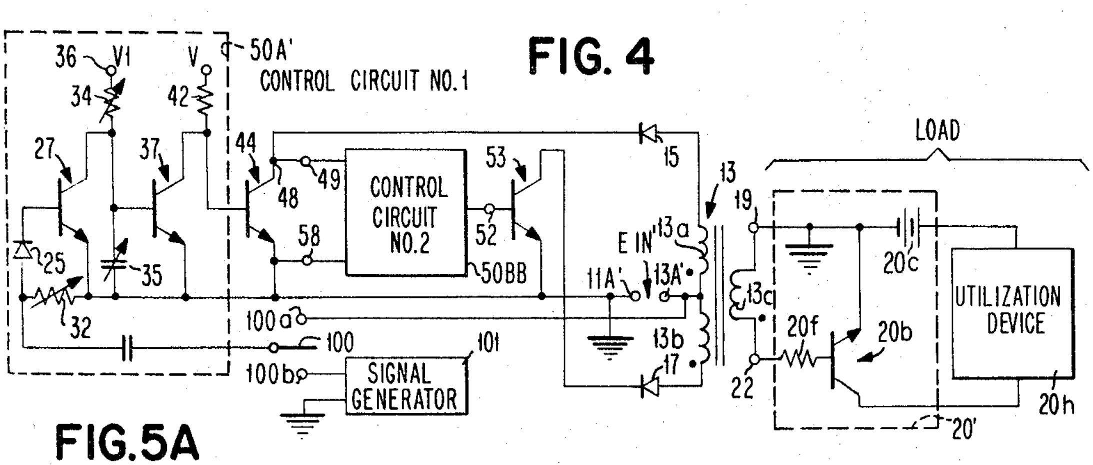
FIG. 4
FIG.5A
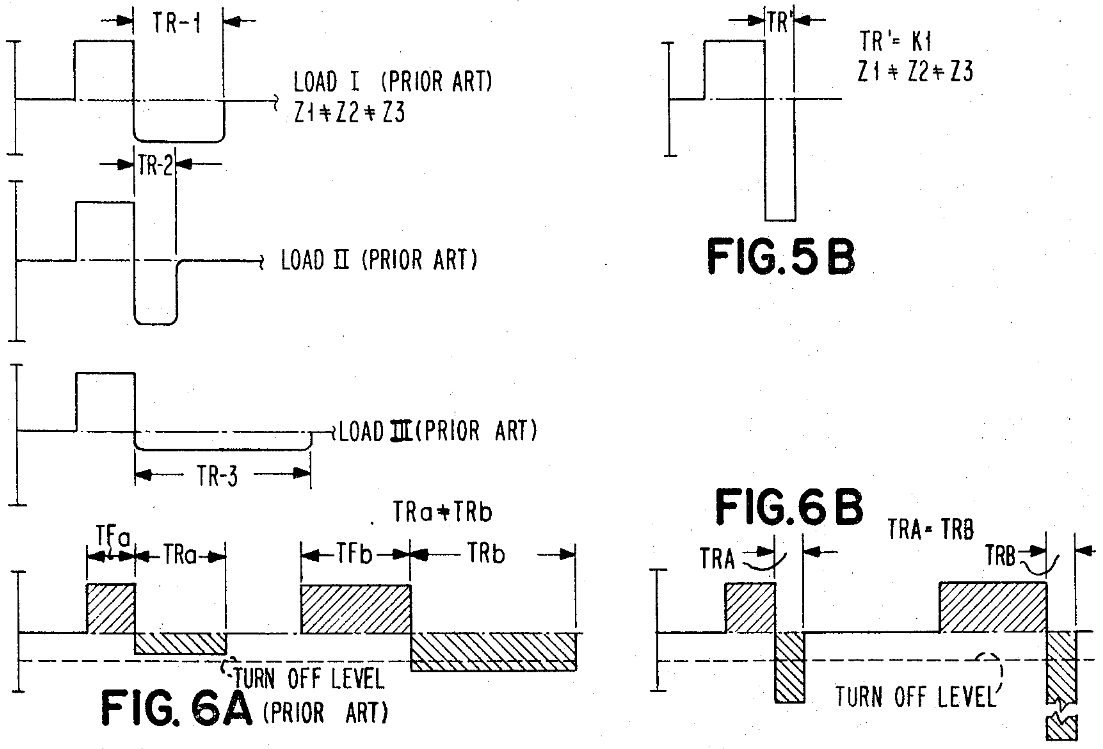
FIG.5B, FIG. 6A (PRIOR ART), FIG.6B
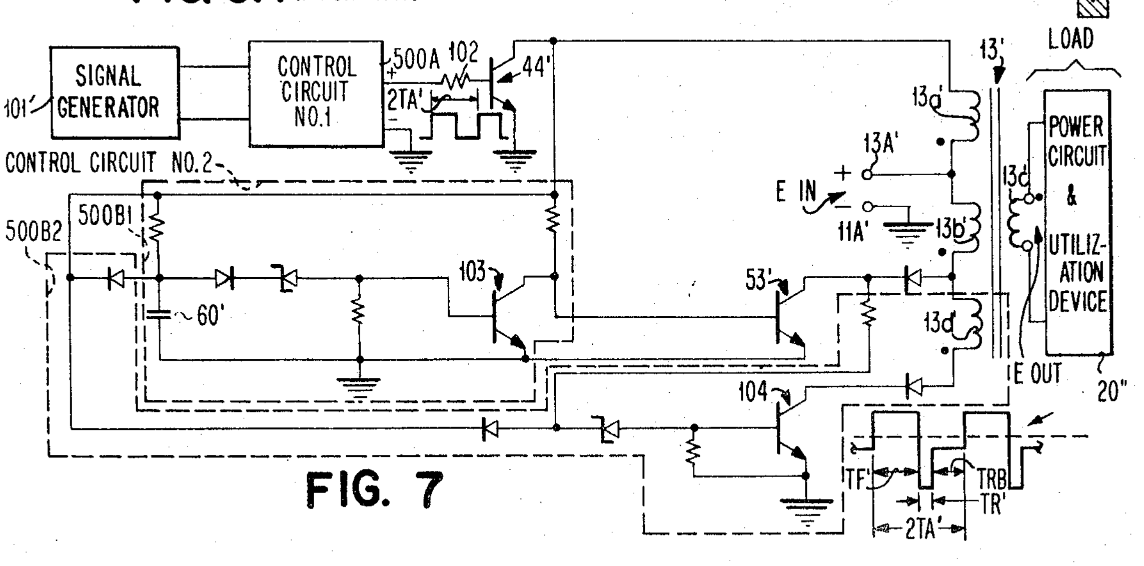
FIG. 7

TRANSISTORIZED SWITCHING CIRCUIT AND DRIVER MEANS THEREFOR

BACKGROUND OF THE INVENTION

This invention relates to a transistorized switching circuit and driver means therefor.

Transistorized switching circuits are used to provide connection between a reference source and a load. In such circuits, the transistor switching element is controlled by a circuit referred to as a driver circuit which provides turn-on and turnoff signals to the tram transistor control input which connects and disconnects, respectively, the reference source and the load. While in the past the turn-on period associated with the turn-on signal pulse was generally well regulated, heretofore the turnoff period was not regulated or controlled resulting in an erratic and unpredictable time period when the particular switching transistor was switched from an ON to an OFF condition and particularly where the driver circuit was of the transformer-coupled type. As a result, the overall duty cycle was not readily controlled with the driver circuits of the prior art and as a consequence adversely affected the performance of the associated load, particularly where the load was associated with a data processor system.

SUMMARY OF THE INVENTION

It is n object of this invention to provide a driver circuit, alone and/or in combination with a transistorized switching circuit, which provides a controlled turnoff signal.

It is another object of this invention to provide a driver circuit of the aforementioned kind wherein the transistorized switching circuit is of the power switching type.

Another object of this invention is to provide a driver circuit of the aforementioned kind which is configured as a single-ended and/or double-ended output device.

Another object of this invention is to provide a driver circuit of the aforementioned kind which provides turn-on and turnoff signals for a transistorized switching circuit, and wherein the turnoff time period is constant and/or where the turnoff signal is constant irrespective of the turn-on time period of the turn-on signal.

Still another object of this invention is to provide a driver circuit of the aforementioned kind which also provides an output signal that reverse biases the transistorized switching mans after each turnoff signal and until the next recurring turnoff signal.

Another object of this invention is to provide a driver circuit of the aforementioned kind in which the turnoff period of the turnoff signal is constant and substantially less than the turn-on signal.

Another object of this invention is to provide a driver circuit of the aforementioned kind that provides a turnoff signal in which the voltage-time product thereof is less than the voltage-time product of the turn-on signal.

Another object of this invention is to provide a driver circuit of the aforementioned kind which employs a transformer-coupled output.

According to one aspect of the invention, a transistorized switching means is provided which has control input means for controlling its ON and OFF states. A first means provides a recurring turn-on signal to the control input means for a predetermined first time period. A second means in response to the termination of each of the turn-on signals provides a turnoff signal having a substantially constant second time period.

Another feature of this invention is to provide a transformer driver circuit for driving a transistorized switching means. The transformer driver circuit comprises at least one transformer having an input winding mean and an output winding means. The output winding means is coupled to the control input means of the transistorized switching means. The input winding means is comprised of two windings. A first circuit means is provided for generating a recurring first signal at the output winding means and such that the switching means is turned on in response to this signal. A second means is provided for generating a second signal at the output winding means in response to each termination of the first signal and such that the switching means is turned off in response to the second signal. Each of the second signals has substantially the same time duration. Each of the first and second circuits contains a mutually exclusive different one of the two input windings.

The foregoing and other objects, features, and advantages of the invention will be apparent from the following more particular description of the preferred embodiments of the invention as illustrated in the accompanying drawing.

BRIEF DESCRIPTION OF THE DRAWING

FIG. 4 is a schematic view of another embodiment of the invention which illustrates a single-ended output driver circuit apparatus thereof;

FIGS. 5A—5B are output waveforms of the prior art and present invention, respectively, helpful in understanding the present invention;

FIGS. 6A—6B are waveforms of the prior art an present invention, respectively, helpful in understanding the present invention; and FIG. 7 is still another embodiment of the present invention.

In the figures, like elements are designated with similar reference numerals.

DESCRIPTION OF THE PREFERRED EMBODIMENTS

Figure 1:
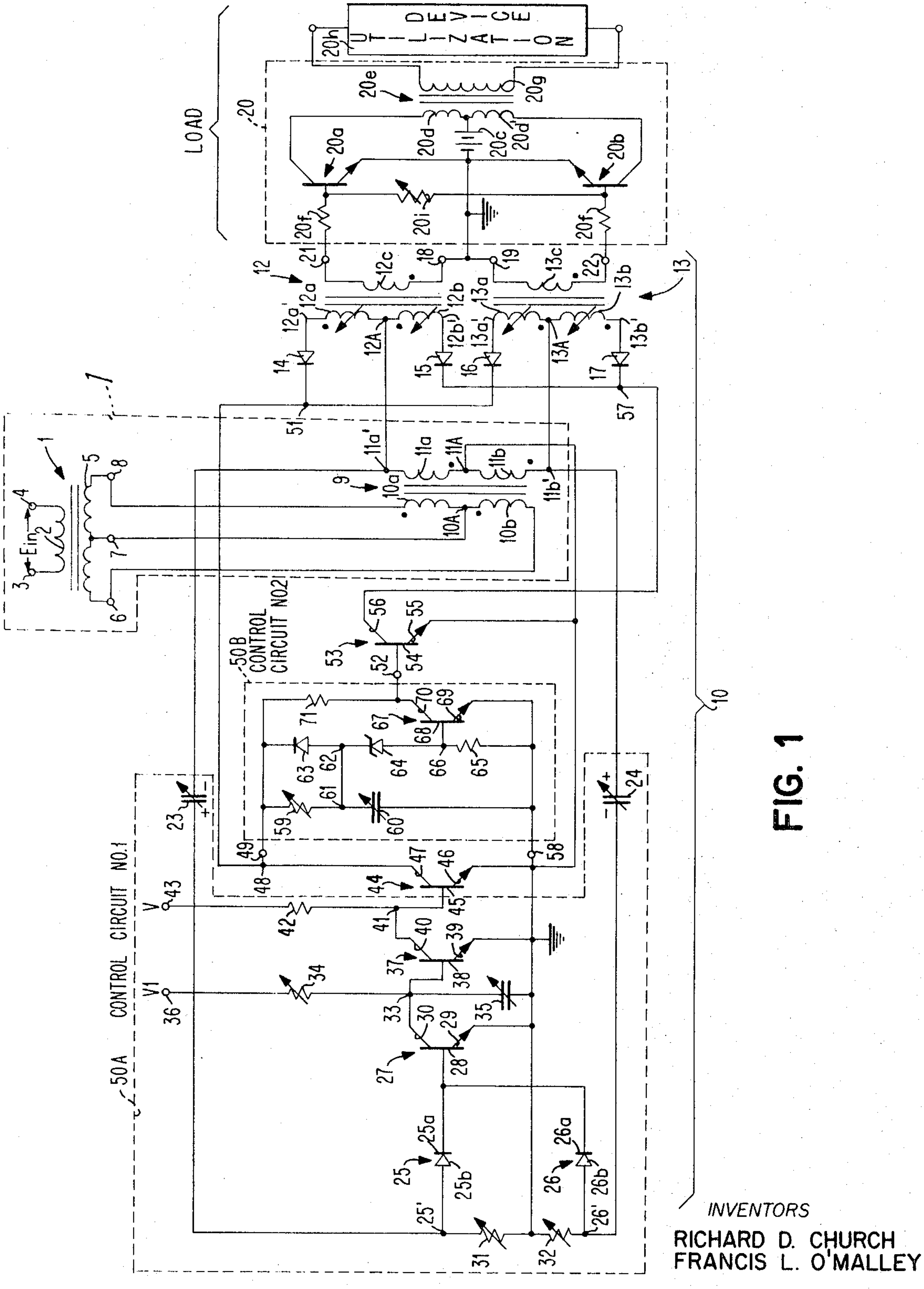
FIG. 1 is a schematic view of a preferred embodiment which illustrates the double-ended output driver circuit apparatus of the present invention, as well as the circuit apparatus combination comprising the driver circuit apparatus and transistorized switching circuit of the present invention.

Referring to FIG. 1, the double-ended output embodiment 10 of the transformer driver circuit apparatus of the present invention comprises a pair of driver transformers 12, 13 which are commonly connected to an alternating bipolar energizing signal source 1—9. The signal source 1—9 is shown in detail within the outlined block 1' for purposes of clarity and includes, by way of example, an input pulse transformer 1 which has a primary winding 2. In operation, transformer 1 is energized by an alternating bipolar pulse signal E*in*, which has half-cycle periods TA, that is applied across input terminals 3, 4 of winding 2. The center-tapped secondary winding 5 is connected to the input terminals 6, 7, 8 of center-tapped pulse transformer 9 and more particularly to the center-tapped primary winding 10*a*13 10*b* thereof. The secondary windings 11*a*—11 of transformer 9 has a grounded center tap 11A. The remote ends 11*a'* and 11*b'* of the winding 11*a*—11*b* are connected, respectively, to the tap 12A of the bifurcated primary winding 12*a*, 12*b* of transformer 12 and the tap 13A of the bifurcated primary winding 13*a*—13*b* of transformer 13. In operation, the source 1—9 thus provides complementary, i.e. opposite, polarity signals to the taps 12A and 13A during each first half-cycle period of the input signal E*in*. The polarities are reversed at the taps 12A and 13A during the second half-cycle period.

The remote ends 12*a'*, 12*b'*, 13*a'*, 13*b'* of the windings 12*a*—12*b*, 13*a*—13*b* are connected to diodes 14—17, respectively. The output terminals 18, 19 of the output windings 12*c* and 13*c*, respectively, of transformers 12 and 13 are commonly connected to the grounded input of a load which includes a switching circuit generally indicated by the dash line block 20. Load 20 is illustrated in FIG. 1 as a three-terminal device having a pair of transistorized switching amplifiers 20*a*, 20*b* configured as grounded common-emitter NPN transistor types. A power supply, shown by way of example as a battery 20*c*, has its positive terminal connected to the center tap of the primary winding 20*d*—20*d* of an output transformer 20*e*. The remote ends of the subwindings 20*d* and 20*d'* are connected to the collectors of transistors 20*a* and 20*b*, respectively, and returned through the respective collector-emitter circuits thereof to the grounded negative terminal of the battery 20*c*. The terminals 21, 22 of the secondary windings 12*c* and 13*c*, respectively, of transformer 12 are connected to the inputs, i.e. the bases, of transistors 20*a* and 20*b* via the respective resistors 20*f*. The output winding 20*g* of transformer 20*e* is connected to a utilization device which is part of the load and is shown generally in block form and indicated by the reference numeral 20*h*.

The remote ends 11*a'*, 11*b'* of winding 11*a*—11*b* of transformer 9 are also connected to a control circuit 50A, shown in outline form for sake of clarity. Control circuit 50A controls the ON and OFF states of a semiconductor switch 44 in a manner hereinafter described. For purposes of explanation, control circuit 50A is sometimes referred to the herein as CONTROL CIRCUIT NO. 1, this designation being also applied to the control circuits of the other embodiments shown in FIGS. 3, 4 and 7 having similar functions for sake of simplicity. The respective coupling capacitors 23, 24 are connected to diodes 25, 26, respectively, which in turn are connected to the control input of a switching amplifier 27 shown by way of example as an NPN transistorized grounded common emitter type also referred to in the art as a common-emitter amplifier. Transistor 27 accordingly has a control input or base 28, an emitter 29, and an output or collector 30. For the particular conductivity type example of transistor 27, the diodes 25, 26 are poled such that their cathodes 25*a*, 26*a* are connected to the base 28, and their anodes 25*b*, 26*b* are connected to the remote ends 11*a'*, 11*b'*. Also connected to the anodes 25*b*, 26*b* at the respective junctions 25', 26' are grounded resistors 31 and 32, respectively. The collector 30 of transistor 27 is connected to the junction 33 of the series-connected resistor 34 and grounded capacitor 35. Resistor 34 is connected to an input terminal 36 to which is connected an adjustably voltage source, not shown, which provides a preselected reference level, e.g. level V1, to the terminal 36. A second switching amplifier 37, also shown by way of example as an NPN common-emitter amplifier, has its control input or base 38 connected to the junction 33. The transistor 37 has a grounded emitter 39 and a collector 40 which is connected to junction 41. A bias voltage level is applied to junction 41 that is derived via resistor 42 from a bias supply, not shown, which provides a bias level V to the terminal 43. Collector 40 is also connected via junction 41 to the control input of the semiconductor switch 44, shown by way of example as an NPN common-emitter amplifier, and more particularly is connected to the base 45 of the latter. Transistor 44 has a grounded emitter 46 and a collector 47 which is connected to junction 48. The latter is in turn is connected to the input terminal 49 of a second control circuit generally indicated within the dash line block 50B hereinafter described. Control circuit 50B controls the ON and OFF states of a semiconductor switch 53 and is sometimes referred to hereinafter as CONTROL CIRCUIT NO. 2. Again, in the other embodiments of FIGS. 3, 4 and 7, the control circuits thereof having similar functions are also provided with this designation for sake of clarity. Junction 48 is also connected to the junction 51 of the diodes 14 and 16. The output of circuit 50B is connected via terminal 52 to the control input of the transistor switch 53. The latter is shown by way of example as an NPN transistorized grounded common-emitter type with a control input or base 54, an emitter 55, and an output or collector 56. Collector 56 is connected to the junction 57 of the diodes 15 and 17. For the particular NPN conductivity types of transistors 44 and 53, the diodes 14—17 are poled such that their respective cathodes are connected to the particular junctions 51, 57.

In the embodiment of FIG. 1, the circuit 50B provides a series-connected resistor 59 and grounded capacitor 60 which are shunted across the terminal 49 and its grounded input terminal 58. The junction 61 of resistor 59 and capacitor 60 is connected to the junction 62 of the diode 63 and Zener diode 64 which forms part of the serially connected circuit comprising diodes 63, 64 and grounded resistor 65. The series-connected circuit 63—65 is also across the terminals 49 and 58. Junction 66 of the diode 64 and resistor 65 is connected to the control input of a switching amplifier 67 shown by way of example as an NPN transistorized grounded common-emitter type with a control input base 68, an emitter 69, and an output or collector 70, the latter being connected to the output terminal 52. A bias resistor 71 connects terminal 49 to the collector 70.

Figure 2B:
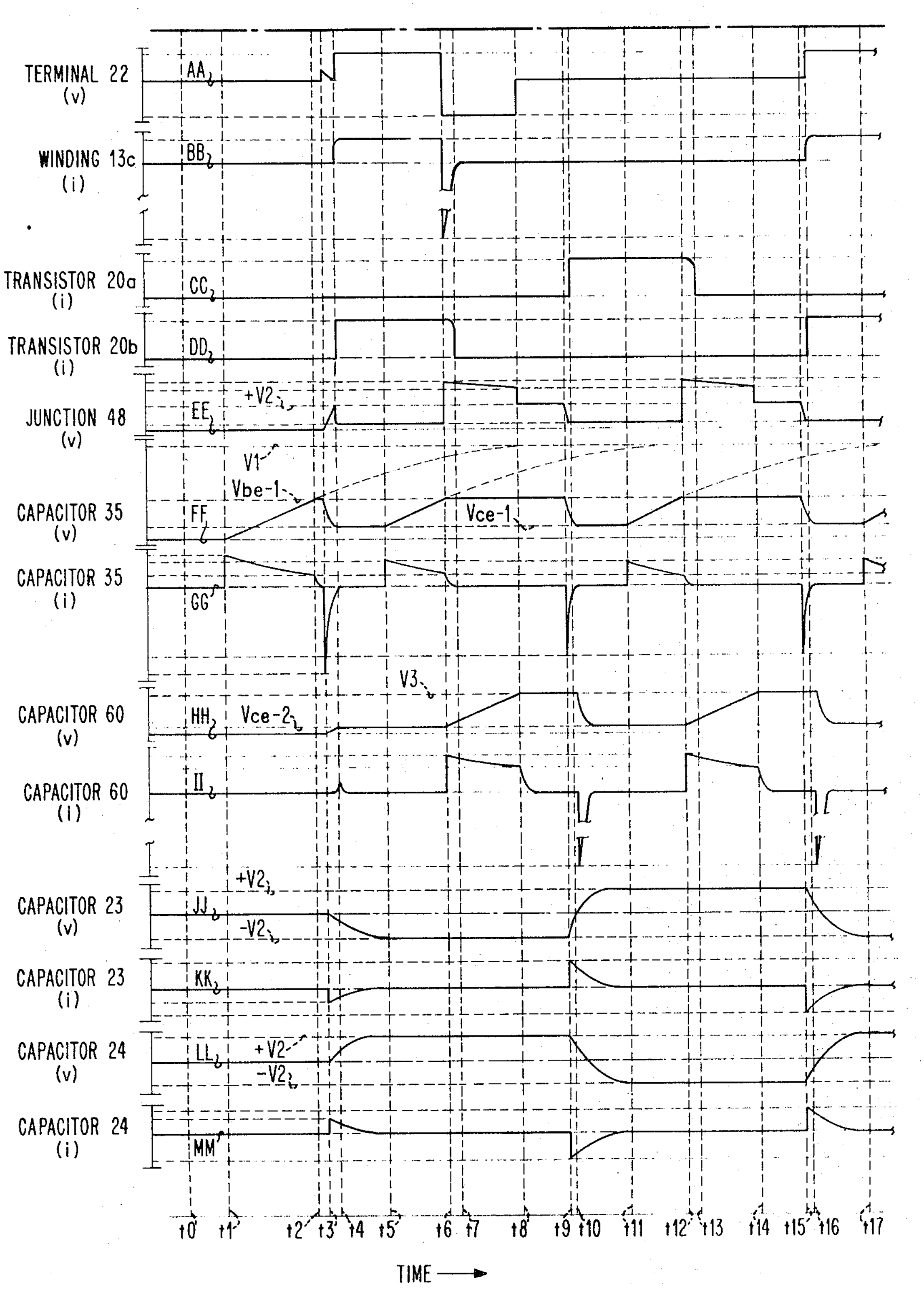
FIGS. 2*a*—2*b* are waveform timing diagrams of various voltage and current waveforms associated with the circuit of FIG. 1, as well as the ON/OFF conditions of the transistors illustrated therein.
Figure 2A:
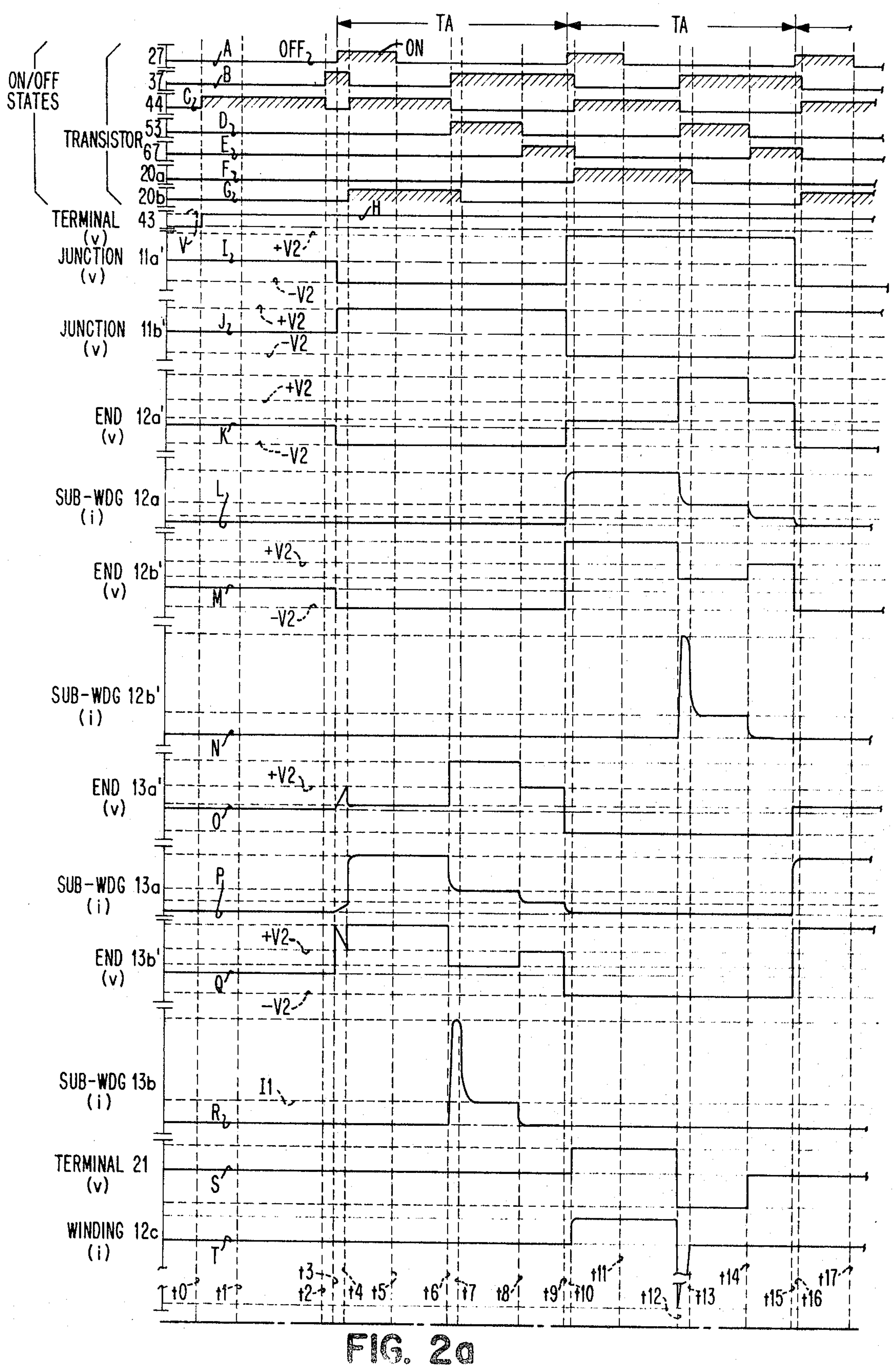

In FIG. 2*a*, waveforms A to G illustrate the respective turned-on states ON and turned-off states OFF of transistors 27, 37, 44, 53, 67, 20*a*, 20*b*, respectively. In waveforms A—G, the ON state periods are crosshatched for purposes of clarity. In FIGS. 2*a*—2*b*, waveforms H to T and AA to MM are ideal voltage and current waveforms associated with different parts of the circuit of FIG. 1 and are shown exaggerated therein for purposes of clarity. The reference characters *v* and *i*, which parenthetically appear along side the ordinate axes associated with the waveforms H—T, AA—MM of FIGS. 2*a*—2*b*, are used to designate the voltage and current waveform types, respectively, shown thereat. The waveforms in FIGS. 2*a*—2*b* are plotted on a common time axis.

Referring now to the waveforms of FIGS. 2*a*—2*b*, the operation of the circuit of FIG. 1 will now be described. Prior to time *t*0, it will be assumed that the aforementioned bias supply, not shown, has not been connected to terminal 43, and the aforementioned adjustable reference voltage source, not shown, has not been connected to terminal 36. It is further assumed that the aforementioned square wave input signal E*in* has not been applied across terminals 3 and 4 of transformer 1. Under these circumstances, all the transistors 27, 37, 44, 53, 67, 20*a* and 20*b* are in their respective turned-off states OFF, c.f. waveforms A—G, and all the other waveforms H to T and AA to MM are at their respective zero or ground levels.

At time *t*0, the bias supply is connected to terminal 43 and provides the bias level V, c.f. waveform H, thereat. It produces a current flow through the reis resistor 42 and base-emitter junction of the transistor 44 causing transistor 44 to turn on, c.f. waveform C. However, due to the absence of an input-applied voltage level to terminal 36 and an applied input signal E*in*, the remainder of the circuit of FIG. 1 is not effected and the rest of the waveforms remain at their respective OFF, zero or ground levels as the particular case might be as is shown in FIGS. 2*a*—2*b*. Consequently, no current flows in the emitter-collector circuit 46—47 of transistor 44.

At time *t*1, a preselected reference voltage level V1 is applied to terminal 36 and capacitor 35 begins to charge through resistor 34, c.f. associated voltage and current waveforms FF and GG, to the level V1. However, when the voltage level on the capacitor 35 reaches the threshold level V*be*-1 of the amplifier 37 at time *t*2, it causes transit transistor 37 to turn on thereby in turn causing a complementary turnoff action in transistor 44, c.f. waveforms FF, B and C. The steady state voltage level across the capacitor 35 becomes fixed or constant at the voltage level V*be*-1 due to the voltage drops developed by voltage V1 across the voltage divider network, i.e. resistor 34 and the base-emitter junction resistance of transistor 37. Correspondingly, the current through capacitor 35, waveform GG, returns to the zero level. However, due to the absence of an input signal E*in*, the remainder of the circuit of FIG. 1 is not effected and the rest of the waveforms remain at their respective OFF, zero or ground levels as the particular case might be as is shown in FIGS. 2*a*—2*b*. Under these circumstances, the current provided by the bias supply level V substantially passes through resistor 42 and the emitter-collector circuit of turned-on transistor 37. The circuit of FIG. 1 is now in condition to receive the input signal E*in*.

At time *t*3, it is assumed that a recurring square wave input signal E*in* having a half-cycle period TA is applied to terminals 3, 4. For purposes of explanation, it is also assumed by way of example that the first half-cycle of the input signal E*in* causes voltages having negative and positive input voltage levels −V2, +V2, to appear at the junctions 11*a*′, 11*b*′, respectively, c.f. waveforms I and J. The negative level −V2, waveform I, appears simultaneously at the junction 12A and the ends 12*a*′ and 12*b*′, c.f. waveforms K and M, and thus at the respective anodes of diodes 14, 15. Due to the manner in which diodes 14 and 15 are poled, the negative level −V2 causes them to be reverse biased during the first half-cycle. Diodes 14, 15 thus effectively isolate the negative level −V2 from the junctions 51, 57, respectively, and as a result no current can flow through either of the subwindings 12*a*, 12*b*, c.f. waveforms L, N. Consequently, no output signal appears at terminal 21 and no current flows in the winding 12*c* during the first half-cycle for the assumed conditions of the signal E*in*, c.f. waveforms S and T. The negative level −V2, waveform I, is also transmitted via junction 11*a*′ to coupling capacitor 23 which begins to charge through resistor 31 to this level, c.f. waveforms JJ and KK. Due to the manner in which the diode 25 is poled, the level −V2 causes a reverse bias to appear across diode 25, c.f. indicated positive and negative polarities associated with electrodes of capacitor 23 shown in FIG. 1, and the base 28 of transistor 27 is thus effectively isolated from junction 25′ by diode 25.

The positive level +V2, waveform J, is transmitted at time *t*3 via junction 11*b*′ to coupling capacitor 24 which begins to charge to this level, c.f. waveform LL. Immediately prior to time *t*3, diode 26 is not conducting but the initial surge of the resulting charge current, c.f. waveform MM, at time *t*3 passing through capacitor 24 and resistor 32 causes a voltage level to be established at junction 26′ that forward biases and exceeds the threshold level of diode 26. In turn, the voltage level at junction 26′ biases the 28 of transistor 27 so as to cu cause the latter to conduct, i.e. to be turned on, c.f. waveform A. Capacitor 24 now continues to charge to the level +V2 through the resistor 32, as well as the series-connected circuit of the forward resistance of the diode 26 and the resistance of the base-emitter junction of transistor 27. When transistor 27 turns on at time *t*3, capacitor 35 is rapidly discharged, c.f. waveforms FF and GG, through the emitter-collector circuit 29—30 of turned-on transistor 27 resulting in the transistor 37 being turned off at time *t*4, c.f. waveform B. At time *t*4, the voltage level of capacitor 35 reaches a steady state level established by the voltage level at junction 33 and which is equal to the saturation collector voltage level V*ce*-1 of turned-on transistor 27, c.f. waveform FF. The turnoff of transistor 37 results in the base 45 of transistor 44 being biased to turn on at time *t*4, c.f. waveform C, in a complementary manner.

At time *t*3, the positive level +V2, waveform J, is also applied to junction 13A. The level +V2 exceeds the threshold levels of diodes 16 and 17 and causes them to be forward biased. However, since switching transistor 53 is turned off at time *t*3, the current path of subwinding 13*b*, which is connected through diode 17, at this time is an open circuit and thus no current can flow through subwinding 13*b*, c.f. waveforms D and R. Consequently, at time *t*3, the voltage at end 13*b*′ is substantially greater and will be at twice the +V2 level if subwindings 13*a* and 13*b* have the same number of turns, as assumed herein, c.f. waveform Q, as explained hereinafter. As will become apparent hereinafter, the subwindings 13*a* and 13*b* and/or 12*a* and 12*b* need not be symmetrical but may be asymmetrical as well. Moreover, with transistor 44 turned off and hence in its open circuit condition at time *t*3, the current path of subwinding 13 *a* is connected through the diode 16 to the input terminal 49 of circuit 50B via junction 48. At time *t*3, the current path of subwinding 13*a* divides into two branch circuits. One branch comprises the series-connected resistor 59 and capacitor 60 and the other branch comprises the series-connected resistor 71 and base-emitter junction of the transistor 53. It should be noted that transistor 67, being in its turned off state, c.f. waveform E, and diodes 63, 64, because of the manner in which they are poled, are effectively open circuits and hence cannot provide current paths for subwinding 13*a* at time *t*3. Due to the transient effects of the inductance of the subwinding 13*a*, the current passing therethrough, c.f. waveform P, and correspondingly its constituent branch currents passing through the aforementioned two branch circuits, do not commence immediately at time *t*3. Thus, at time *t*3, the junction 48 and end 13*a*′ will be approximately at the zero voltage level, c.f. waveforms EE and O, and consequently the voltage, waveform Q, of end 13*b*′ is at the aforementioned doubled +V2 level. As the current in subwinding 13*a* begins to increase, c.f. waveform P, the voltage levels at junction 48 and end 13*a*′ correspondingly begin to increase, c.f. waveforms EE and O, and the substantial part of the voltage drop caused by the voltage level +V2 begins to appear across the two aforementioned branch circuits. During the period *t*3—*t*4 the aforementioned branch currents begin, respectively, to charge the capacitor 60, c.f. waveforms HH and II, and to pass through the series-connected resistor 71 and the base-emitter junction of the transistor 53. However, the amplitudes of the appropriate branch currents are insufficient to cause, respectively, breakdown of the Zener diode 64 and turn-on of transistor 53 during the period *t*3—*t*4. Moreover, the small current change in subwinding 13*a* during the period *t*3—*t*4 provides a negligible change in the current of the winding 13*c*, c.f. waveforms P and BB, and consequently the voltage at terminal 22 remains at its near-zero level and transistor 20*b*remains turned off, c.f. waveforms AA and G. For sake of clarity and purposes of explanation, the time period *t*3—*t*4 is shown greatly exaggerated in the waveforms of FIGS. 2*a*—2*b*.

At time *t*4, when transistor 44 is turned on as previously explained, the resultant relatively lower impedance path of the collector-emitter circuit of transistor 44 causes the current from subwinding 13*a* to increase, c.f. waveform P, and to bypass or short circuit the input terminal 49. Due to the accompanying transformer action of transformer 13, the increased current causes a corresponding decrease in the voltages at end 13*a*′ and junction 48, c.f. waveforms O and EE, and a corresponding increase in the voltage at end 13*b*′. Moreover, the current increase in the subwinding 13*a* and accompanying corresponding transformer action of transformer 13 causes a substantial change in the current in the secondary winding 13*c*, c.f. waveform BB. The secondary current of winding 13*c*flows through the base-emitter circuit of the transistor 20*b*and is of sufficient amplitude to bias transistor 20*b* to turn on, c.f. waveform G. With transistor 20*b* turned on, subwinding 20*d*′ of transformer 20*e* is energized by the battery 20*c* and the output winding 20*g* delivers a current to the load 20*h*. Coincidentally, at time *t*4, when transistor 44 turns on, capacitor 60 becomes charged substantially to a to a steady state level V*ce*-2 which is the saturation collector voltage level of turned-on transistor 44, c.f. waveform HH, and which is also the voltage level of junction 48, c.f. waveform EE. Under these circumstances, the current through capacitor 60 returns to its zero level, c.f. waveform II.

At time *t*5, the capacitor 24 is charged to the level +V2 and the current passing therethrough has terminated, c.f. waveforms LL and MM, resulting in the base 28 of transistor 27 falling below its threshold value and the transistor 27 consequently being turned off, c.f. waveform A. As shown by the waveform FF, capacitor 35 begins to recharge to the level V1 from its previous level V*ce*-1. The voltage, waveform FF, of capacitor 35 reaches the level V*be*-1 at time *t*6 turning on transistor 37, c.f. waveform B, and resulting in the complementary turnoff action of transistor 44, c.f. waveform C. The current, waveform P, passing through subwinding 13*a* now decreases at time *t*6 due to the turnoff of transistor 44 and again begins to divide proportionally through the two aforementioned branch circuits. The branch current passing through the series-connected resistor 71 and base-emitter junction of transistor 53 is of sufficient amplitude to switch transistor 53 to its turned-on condition at time *t*6, c.f. waveforms P and D. The turnoff of transistor 44 and the turn-on of transistor 53 produces a corresponding increase or rise in the voltage level of end 13*a'* and a corresponding decrease in the voltage level of the end 13*b'*, c.f. waveforms O and Q. As a result, the voltage at terminal 22 is reversed, c.f. waveforms AA and at time *t*6 the level at the base of transistor 20*b* falls below the latter's threshold level. However, due to the storage effects of transistor 20*b*, the latter remains in a turned-on condition until time *t*7, c.f. waveform G, and the associated biasing current, waveform BB, passes through the series-connected winding 13*c*, resistor 20*f* and base-emitter junction of transistor 20*b* in a reverse direction. A resultant reflected current, waveform R, is passed during period *t*6—*t*7 through subwinding 13*b*and through the emitter-collector circuit of turned-on transistor 53. It should be understood that during the time period *t*6—*t*7 the current through the load 20*h* is in the same direction as during the period *t*4—*t*6.

At time *t*7 when transistor 20*b* is effectively in its turned-off condition and its storage time has terminated, its collector-emitter circuit provides an open circuit in the current path of the subwinding 20*d'* and hence effectively disconnects the load 20*h* from the output winding 20*g*. As a result, the reflected current in subwinding 13*b* terminates and the current therethrough reaches a residual level I1 which is substantially determined by the circuit impedance associated with the subwinding 13*a*, forward resistance of the diode 17, the collector-emitter circuit resistance of transistor 53 and the voltage level at junction 11*b'*, c.f. waveforms R and J.

During the period *t*6—*t*8, subwinding 13*a* provides a branch current through the series-connected resistor 59 and capacitor 60 which is charging the capacitor 60, c.f. waveform HH. When the voltage, waveform HH, across capacitor 60 reaches the breakdown level V3 of Zener diode 64, another current path is provided through the series-connected forward resistance of diode 64 and the resistor 65 which establishes a bias at the base 68 of transistor 67 causing the latter to turn on, c.f. waveform E. The turn-on of transistor 67 causes a complementary turnoff action of transistor 53, c.f. waveform D, and as the current, which passes through resistor 71, is diverted from the terminal 52 it now passes through the lower collector-emitter circuit impedance of turned-on transistor 67. As a result, the current in subwinding 13*b* and the voltage level at terminal 22 at time *t*8 return to their respective zero levels, c.f. waveforms R and AA and the voltage level at end 13*b'* returns to the positive level +V2. With transistor 67 now in its turned-on condition, the capacitor 60 stops charging as aforementioned and the charge current therethrough consequently returns to its zero level, c.f. waveform II.

The voltage level at end 13*a* at time *t*8 also returns to the +V2 level and there is a corresponding decrease in the current in subwinding 13*a*, c.f. waveforms O and P. The circuit remains in this condition until the commencement of the next half-cycle of the input signal E*in* which occurs at time *t*9.

At the commencement of the second half-cycle period TA of the input signal E*in*, the voltage levels at junctions 11*a'*, 11*b'* are reversed, c.f. waveforms I and J, at time *t*9. The negative level −V2, waveform J, appears at and reverse biases the respective anodes of diodes 16, 17. Thus, the negative level −V2 is isolated from the junctions 51, 57, respectively, and no current can flow through either of the subwindings 13*a*, 13*b* during the second half-cycle period. Consequently, no output signals appear at terminal 22 and no current flows in the winding 13*c* during the second half-cycle period, c.f. waveforms AA, BB. The negative voltage level appears at the end 11*b'* causing the capacitor 24 to begin charging to this level, c.f. waveforms LL, MM. However, due to the manner in which the diode 26 is poled, the base 28 of transistor 27 is effectively isolated from the capacitor 24.

As is shown by the waveforms of FIGS. 2*a*—2*b*, the operation of the circuit of FIG. 1 during the second half-cycle period *t*9—*t*15 is substantially similar to the operation of the circuit of FIG. 1 during the first half-cycle period *t*3—*t*9 except that the upper transformer 12, which controls the output transistor 20*a*, is utilized therein in lieu of the lower transformer 13. Furthermore, the transistor 67 during the second and subsequent half-cycle periods is initially maintained in its turned-on period at the commencement of the particular half-cycle period and thus maintains the transistor 53 in a turned-off condition during the initial transition period, e.g. *t*9—*t*10, *t*15—*t*16, etc. Transistor 67 is turned-off when transistor 44 is subsequently turned-on during the particular half-cycle period, c.f. waveforms C, D, and E.

Figure 3:
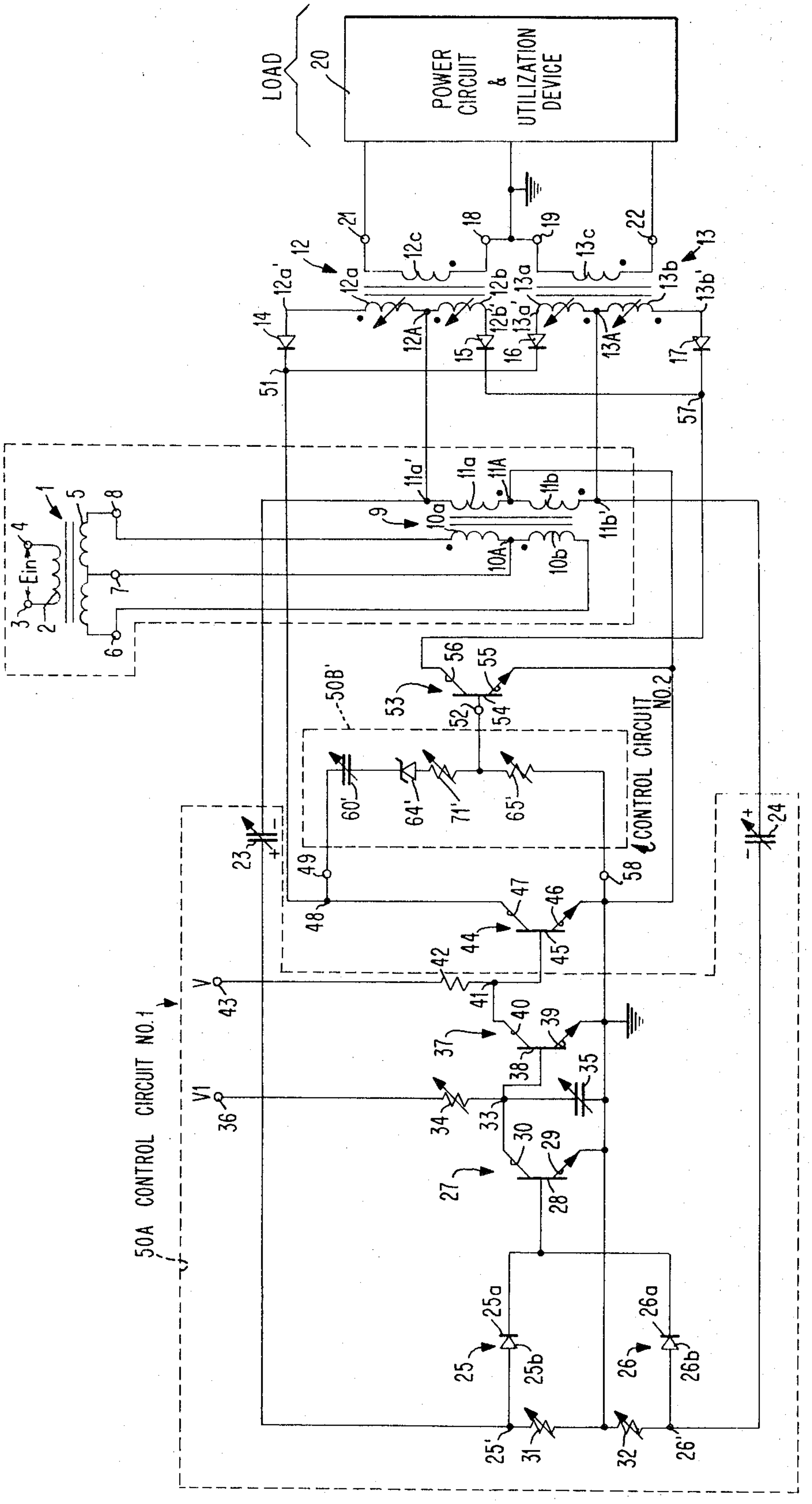
FIG. 3 is a schematic view of a modified form of the embodiment of the invention of FIG. 1.

Referring now to FIG. 3 there is shown an alternate control circuit 50B' for controlling the transistor 53. The circuit 50B' includes the series-connected elements, to wit: capacitor 60', Zener diode 64', and resistors 71' and 65' which are shunted across the terminals 49, 58. The base 54 of transistor 53 is connected to the junction of the resistors 65' and 71' via terminal 52.

In operation, when transistor 44 of FIG. 3 is turned off the voltage level at junction 48 causes the Zener diode 64' to be forward biased. At this time the capacitor 60' begins to charge and the initial surge of the current from the appropriate subwinding 12*a* or 13*a*, as the case might be, passes therethrough and through the series connected resistances of the Zener diode 64', resistor 71' and resistor 65'. The amplitude of the initial surge of the current biases transistor 53 to its turned-on condition. As the capacitor 60' charges, the current decreases and transistor 53 turns off when the amplitude of the decreasing current falls below the threshold level of transistor 53. When transistor 44 is turned on, the capacitor 60' discharges through the path including the collector-emitter circuit of transistor 44.

In the aforedescribed operations of the circuits of FIGS. 1 and 3, the transistors 20*a*, 20*b* are operated in a push-pull manner. Preferably, under these circumstances the resistor 20*i* is not connected between their respective bases. Alternatively, the resistor 20*i* can be adjusted to have a relatively high resistance so that only an insufficient negligible current passes through it. It should also be understood, as is apparent to those skilled in the art, transistor 20*a*, 20*b* could be operated in parallel during each half-cycle period TA in which case the resistor 20*i* would be adjusted to have a low impedance.

Typical values for the circuits of FIGS. 1 and 3 are indicated in Table I, as follows:

Table I

| | | |
|---|---|---|
| Transistor **27** | — | Type 2N914 |
| Transistor **37** | — | Type 2N914 |
| Transistor **44** | — | Type 2N2243A |
| Transistor **53** | — | Type 2N2243A |
| Transistor **67** | — | Type 2N914 |
| Transistors **20***a*, **20***b* | — | Type 2N3055, each |
| Diodes **14**—**17** | — | Type HFR20, each |
| Diodes **25***a*, **26***a* | — | Type HFR20, each |
| Diode **63** | — | Type HFR20 |
| Zener diodes **64**, **64'** | — | Type 1N752, each |
| Resistors **31**, **32** | — | 1,380 ohms, each |
| Resistor **34** | — | 715ohms |
| Resistor **42** | — | 356 ohms |
| Resistor **59** | — | 1,000 ohms |
| Resistor **65** | — | 715 ohms |
| Resistor **65'** | — | 715 ohms |

Table I - continued

| | | |
|---|---|---|
| Resistor **71** | — | 910 ohms |
| Resistor **71'** | — | 910 ohms |
| Resistors **20***f* | — | 0.43 ohms, each |
| Capacitors **23**, **24** | — | 820 uuf., each |
| Capacitor **35** | — | 0.22 uf. |
| Capacitor **60** | — | 0.001 uf. |
| Capacitor **60'** | — | 820 uuf. |

Referring now to FIG. 4 there is shown a single-ended output embodiment of the driver circuit of the present invention. It includes the transformer 13 which has a pair of bifurcated input subwindings 13*a* and 13*b* that are connected to transistors 44 and 53, respectively, via the respective diodes 15, 17. Transistor 44 is under the control circuit 50A' designated as CONTROL CIRCUIT NO. 1 therein and transistor 53 is under the control of a control circuit 50BB designated therein as CONTROL CIRCUIT NO. 2. Control circuit 50BB may be configured, for example, similar to the circuit 50B of FIG. 1 or 50B' of FIG. 3 previously described. Control circuit 50A' and control circuit 50BB include timing networks therein for operating the transistors 44 and 53 in a complementary manner. In one mode of operation, with the switch 100 in a closed position with upper contact 100A, the signal E*in'* is a recurring pulse signal of the appropriate polarity compatible with the transistor type employed for transistors 44, 53, which for the illustrated NPN type is a positive polarity. The signal E*in'* is applied to the input terminals 11A', 13A' and energizes the subwindings 13*a*, 13*b* in a manner similar to the previously described double-ended output embodiment of FIGS. 1 and 3. The recurring signal E*in'* under these circumstances thus not only acts as an energizing signal for the windings 13*a*, 13*b* but also is the signal which actuates CONTROL CIRCUIT NO. 1 of FIG. 4. Alternatively, with the switch 100 in a closed position with the lower contact 100B, a signal generator 101 provides actuating signals that periodically actuate the control circuit 50A' thus providing an independent actuating means for the control circuit 50A'. In this latter mode of operation, signal E*in'* is a DC signal of the appropriate polarity and is provided, for example, by a DC power supply such as a battery or the like.

Referring now to the waveforms of FIGS. 5A—5B, as aforementioned, the driver circuits of the prior art did not provide a driver signal having a controllable turnoff or reverse time period. For example, a typical prior art driver would provide three different turnoff time periods TR-1, TR-2 and TR-3 for three different impedance values Z1, Z2, Z3, respectively, of the loads I, II, and III connected to its output as shown graphically by the family of the three output waveforms in FIG. 5A. Moreover, even when the load impedance connected to the output of the driver circuits of the prior art was momentarily constant, the reverse time period was not controllable due to the inherent impedance and transient characteristic of the driver circuit per se. For example, in those cases where the driver circuit employed a transformer-coupled output, the previous magnetic history of the transformer core caused the turnoff period to vary erratically and randomly, that is in an unpredictable manner. As shown in FIG. 5B, the turnoff or reverse period TR' of the output signal of the driver circuit of the present invention is a constant K1 regardless of the different impedance values Z1, Z2, Z3 of the load or loads which may be connected thereto, and/or regardless of the inherent impedance or transient characteristics of the driver circuit per se, and especially where the driver circuit is of the transformer-coupled type described herein.

Furthermore, in addition, the reverse time period associated with the turnoff driver signal is also dependent upon the forward time period associated with its corresponding turn-on signal. Thus, as shown in FIG. 6A for a certain prior art device and a given load impedance, it was necessary to provide a sufficient turn-on period so that the subsequent voltage-time period associated with the turnoff level was of suffice sufficient amplitude to turnoff the switching transistor being controlled. For example, as shown in FIG. 6A, the time period TF*a* of the driver circuit signal of a typical prior art driver circuit is insufficient to cause the turnoff of the transistorized switch being controlled in a subsequent reverse period TR*a*. As shown by the second cycle, however, the turn-on signal associated with the turn-on period TF*b* is of sufficient duration to cause the turnoff signal associated with the turnoff period TR*b* to be of sufficient amplitude to exceed the turnoff level of the transistorized switch being controlled. However, in accordance with the present invention, by judicious design of the transformer driver windings and the timing networks of the CONTROL CIRCUIT NOS. 1 and 2, the amplitude of the turnoff driver signal is of sufficient amplitude to turnoff turn off the transistor switch being controlled irrespective of the duration of the time period of the turn-on signal, c.f. turnoff time periods TRA = TRB, FIG. 6B.

In the aforedescribed embodiments, FIGS. 1, 3 and 4, the integral of the voltage with respect to time, that is the voltage-time product or area associated with the turnoff period, is substantially equal to the integral or the voltage-time product associated with the turn-on period of its corresponding turn-on signal in accordance with well-known transformer principles. However, it is also contemplated by the present invention that during the turnoff period the integral of the voltage with respect to time associated therewith can be made substantially less than the integral of the voltage with respect to time associated with the turn-on period of its corresponding turn-on signal and during the period between the turnoff period and the occurrence of the next turn-on signal a reverse bias is maintained on the control input of the transistor switch being controlled. An embodiment which claims these principles will next be described with reference to FIG. 7.

In the embodiment shown in FIG. 7, CONTROL CIRCUIT NO. 2 comprises two subcircuits 500B1 and 500B2. Network 500B1 controls the ON/OFF condition of transistor 53' in a manner corresponding to the control of transistor 53 of the embodiments. Network 500B2, in addition, provides means for providing a reverse bias on the switching transistor, not shown, associated with the load 20'' as shown by the output waveform E*out*. More specifically, as shown in FIG. 7, transistor 44 is controlled by a control circuit 500A which is actuated by a sing signal generator 101'. In response thereto, control circuit 500A provides input pulses to the base of transistor 44' is a CONTROL CIRCUIT NO. 2 which comprises the two subcircuits 500B1 and 500B2. In operation, application of an input pulse from control circuit 500A to the base of transistor 44' causes the latter to turn on and as a result current supplied from the battery, not shown, applied to the terminals 13A', 11A' passes through the winding 13*a'*. Under these circumstances, transistor 53' is turned off as well as the transistors 103 and 104. As a consequence, no current, i.e. negligible current, passes through the windings 13*b'* or 13*d'*. During the application of the input pulse, a turn-on output signal appears at the winding 13*c'* maintaining the transistorized switching means, not shown, of load 20'' in a turned-on condition. When the input pulse from the circuit 500A terminates, transistor 44' turns off resulting in the turn-on of transistor 53'. Simultaneously, capacitor 60' commences to charge to the turned-off collector voltage level of transistor 44'. Eventually, the voltage across capacitor 60' reaches a level which biases the transistor 103 to turn on causing transistor 53' to turn off. In turn, the turnoff of transistor 53' causes transistor 104 to turn on and current to pass through the feedback winding 13*d'* provided by transformer 13'. The windings of the transformer 13' and the timing network of the circuit 500B1 are judiciously selected such that the integral or the voltage-time product of the turnoff period TR' is substantially much smaller than the one associated with the turn-on period TF' of the corresponding turn-on signal and in addition is such that the reverse period TRB is of sufficient amplitude and duration to maintain the transistorized switching means, not shown, of load 20'' in a reverse-biased condition.

By disconnecting the subcircuit 500B2 therefrom, it is apparent the remainder of the circuit of FIG. 7 would perform in a manner similar to that of the embodiment of FIG. 4 when the switch 100 thereof is in the closed position with contact 100*b*. In this latter case, the integral or voltage-time product of the turnoff driver signal would be substantially equal to the integral or voltage-time product of the turn-on driver signal.

It should be understood that while the invention has been described with particular NPN transistor types that the invention could be practiced with PNP or complementary types of transistors by appropriate changes in the signal polarities. Moreover, it is to be understood that the invention is preferably practiced with transistorized switching circuits of the power switching type. Moreover, the invention may be practiced to provide asymmetrical recurring driver signals as well as those described herein as symmetrical driver signals as is known to those skilled in the art.

Thus, while the invention has been particularly shown and described with reference to the preferred embodiments, it will be understood by those skilled in the art that the foregoing and other changes in form and detail may be made therein without departing from the spirit and scope of the invention.

We claim:

1. Circuit apparatus comprising in combination:
transistorized switching mean having control input means for controlling the on and off states thereof;
first means providing a recurring turn-on signal to said control input means for a predetermined first time period;
second means in response to the termination of each of said turn-on signals providing a turnoff signal having a substantially constant second time period irrespective of any change in the magnitude of said first time period, and wherein said second time period is substantially less than each of said first tie periods; and
wherein said second means further provides a reverse-bias signal for maintaining the control input means of said transistorized switching means in a reverse-biased condition after each turnoff signal and until the next turn-on signal occurs.

2. Circuit apparatus according to claim 1 wherein said transistorized switching means is of the power switching type.

3. Circuit apparatus comprising in combination:
transistorized switching means having control input means for controlling the on and off states thereof;
first means providing a recurring turn-on signal to said control input means for a predetermined first time period;
second means in response to the termination of each of said turn-on signals providing a turnoff signal having a substantially constant second time period; and
wherein said second time period is substantially less than each of said first time periods, and wherein said second means provide a reverse-bias signal for maintaining the control input means of said transistorized switching means in a reverse-biased condition after each turnoff time period and until the next turn-on signal time period occurs, the integral of the voltage with respect to time of the turn-on signal applied to said control input means during the turn-on time period being sufficiently greater than the integral of the voltage with respect to time of the turnoff signal applied to said control input means during the turnoff time period.

4. Circuit apparatus comprising:
transistorized switching means having control input means for controlling the on and off states thereof;
a transformer having first and second input windings and an output winding, said control means being coupled to said output winding;
an energizing signal source;
a first transistor having a first input, first output, and a first common terminal means associated therewith, said first input winding and said energizing signal source being in a series coupling relationship with said first output and said first common terminal means;
a second transistor having a second input, second output, and a second common terminal means associated therewith, said second input winding and said energizing signal source being in a series coupling relationship with said second output and said second common terminal means;
first control means coupled to said first input means of said first transistor for providing a first control signal for selectively turning on and turning off said first transistor;
second control means coupled to said second input means of said second transistor for providing second control signals for selectively turning on and turning off said second transistor; said first and second control means operating said first and second transistors in a complementary manner, said first input winding providing a first output signal at said output winding to turn on said transistorized switching means in response to said first transistor being placed in a turned-on condition by said first control means, said second input winding providing a second output signal at said output winding to turnoff said transistorized switching means in response to said second transistor being placed in a turned-on condition by said second control means, said second output turnoff signal having a substantially constant time period; and
wherein said energizing signal source provides a recurring energizing signal, said first control means being responsive to said energizing signal, and said second control means being shunted across said first output and first common terminal means of said first transistor so as to control said second transistor in response to the turn-on and turnoff conditions of said first transistor in the aforesaid complementary manner.

5. Circuit apparatus according to claim 4 wherein said first control means further comprises a first timing network, and said second control means comprises a second timing network.

6. Circuit apparatus according to claim 5 wherein said second output turnoff signal has a substantially constant time period irrespective of the time period of said output turn-on signal.

7. Circuit apparatus comprising:
transistorized switching means having a control input means for controlling the on and off states thereof;
a transformer having first and second input windings and an output winding, said control means being coupled to said output winding;
an energizing signal source;
a first transistor having a first input, first output, and a first common terminal means associated therewith, said first input winding and said energizing signal source being in a series-coupling relationship with said first output and said first common terminal means;
a second transistor having a second input, second output, and a second common terminal means associated therewith, said second input winding and said energizing signal source being in a series-coupling relationship with said second output and said second common terminal means;
first control means coupled to said first input means of said first transistor for providing a first control signal for selectively turning on and turning off said first transistor; and
second control means coupled to said second input men means of said second transistor for providing second control signals for selectively turning on and turning off said second transistor; said first and second control means operating said first and second transistors in a complementary manner, said first input winding providing a first output signal at said output winding to turn on said transistorized switching means in response to said first transistor being placed in a turned-on condition by said first control means, said second input winding providing a second output signal at said output winding to turnoff said transistorized switching means in response to said second transistor being placed in a turned-on condition by said second control means, said second output turnoff signal having a substantially constant time period; and wherein said energizing signal source provides a DC energizing signal, a said circuit apparatus further comprising a signal generator for actuating said first control means, said second control means being shunted across first output and first common terminal means of said first transistor so as to control said second transistor in response to the turn-on and turnoff conditions of said first transistor in the aforesaid complementary manner.

8. Circuit apparatus according to claim 7 wherein said second control means further comprises a timing network coupled to said second input means of said second transistor for placing said second transistor in a turned-off condition for said constant time period, said second control means further comprising a third winding coupled to said transformer and a third transistor having a third transistor having a third input and a third common terminal means serially connected to said third winding, said third transistor further having third input means coupled to said second output means of said second transistor and to said timing network, said third transistor being placed in a turned-on condition in response to the turnoff of said second transistor and maintained in said turned-on condition by said timing network so as to provide a third output signal at said output winding to maintain said control input means of said transistorized switching means in a reverse-biased condition until the next one of said first output signals is applied thereto.

9. Circuit apparatus according to claim 8 wherein the integral of the voltage with respect to time of the output turn-on signal applied to said control input means of said transistorized switching means during the turn-on period is relatively greater than the integral of the voltage with respect to time of the turnoff signal applied to said control input means during the turnoff time period.

10. Transformer driver circuit apparatus for driving transistorized switching means having control means for controlling the on and off states thereof, said driver circuit apparatus comprising:

at least one transformer having input winding means and output winding means being coupled to said control input means, and said input winding means having first and second windings;

first circuit means for generating a recurring first signal at said output winding means, said switching means being turned-on in response to said first signal; and second circuit means for generating a second signal at said output winding means in response to each termination of the first signals, said switching means being turned off in response to said second signals, said second circuit providing each of the second signals with substantially the same time duration, said first winding being comprised in said first circuit means and said second winding being comprised in said second circuit means;

wherein said second circuit means further provides a third signal at said output winding means at each termination of said second signals, said third signal providing a bias level at said control input means sufficient to maintain said switching means turned off until the application of the next one of said first signals, and wherein said third signal maintains the control input means of said transistorized switching means in a reverse-biased condition, the integral of the voltage with respect to time of a said first signal applied to said control input means during the corresponding turn-on period being sufficiently greater than the integral of the voltage with respect to time of the subsequent second signal applied to said control input means during the corresponding turnoff time period thereof.

11. Transformer driver circuit apparatus according to claim 10 wherein said transformer has another winding means to induce said third signal at said output winding means, said another winding means being comprised in said second circuit means.